United States Patent
Kim et al.

(10) Patent No.: US 10,833,187 B2
(45) Date of Patent: Nov. 10, 2020

(54) LOW RESISTANCE CONTACT INTERLAYER FOR SEMICONDUCTOR DEVICES

(71) Applicant: INTERNATIONAL BUSINESS MACHINES CORPORATION, Armonk, NY (US)

(72) Inventors: Jeehwan Kim, Los Angeles, CA (US); Wencong Liu, Shandong (CN); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 205 days.

(21) Appl. No.: 14/821,330

(22) Filed: Aug. 7, 2015

(65) Prior Publication Data
US 2017/0040463 A1    Feb. 9, 2017

(51) Int. Cl.
| | |
|---|---|
| *H01L 29/78* | (2006.01) |
| *H01L 29/267* | (2006.01) |
| *H01L 29/66* | (2006.01) |
| *H01L 29/08* | (2006.01) |
| *H01L 29/45* | (2006.01) |
| *H01L 21/441* | (2006.01) |
| *H01L 29/861* | (2006.01) |

(52) U.S. Cl.
CPC ............ *H01L 29/78* (2013.01); *H01L 21/441* (2013.01); *H01L 29/0847* (2013.01); *H01L 29/267* (2013.01); *H01L 29/45* (2013.01); *H01L 29/66522* (2013.01); *H01L 29/8611* (2013.01)

(58) Field of Classification Search
CPC ............ H01L 29/267; H01L 29/66969; H01L 29/0847; H01L 29/66522
See application file for complete search history.

(56) References Cited

U.S. PATENT DOCUMENTS

| | | | | |
|---|---|---|---|---|
| 5,889,295 | A | * 3/1999 | Rennie | ................... H01L 33/28 257/102 |
| 5,989,984 | A | 11/1999 | Anderson et al. | |
| 6,228,748 | B1 | 5/2001 | Anderson et al. | |
| 6,858,522 | B1 | 2/2005 | Burton et al. | |

(Continued)

FOREIGN PATENT DOCUMENTS

KR    1020010066137 A    7/2001

OTHER PUBLICATIONS

Specific contact resistance of Ti/Al/Pt/Au ohmic conatcts to phosphorus-doped ZnO thin films; K. Ip et al.; J. Vac. Sci. Tech. B; vol. 22(1); p. 171; Jan./Feb. 2004.*

(Continued)

*Primary Examiner* — Samuel A Gebremariam
*Assistant Examiner* — Jonas T Beardsley
(74) *Attorney, Agent, or Firm* — Tutunjian & Bitetto, P.C.; Erik Johnson

(57) ABSTRACT

A semiconductor device includes a substrate and a p-doped layer including a doped III-V material on the substrate. An n-type material is formed on or in the p-doped layer. The n-type material includes an oxide of a II-VI material. An oxygen scavenging interlayer is formed on the n-type material. An aluminum contact is formed in direct contact with the oxygen scavenging interlayer to form an electronic device.

16 Claims, 6 Drawing Sheets

(56) References Cited

U.S. PATENT DOCUMENTS

| | | | |
|---|---|---|---|
| 7,993,987 B1 | 8/2011 | Knarr et al. | |
| 2002/0171077 A1* | 11/2002 | Chu | B82Y 20/00 |
| | | | 257/19 |
| 2011/0147708 A1* | 6/2011 | Radosavljevic | B82Y 10/00 |
| | | | 257/24 |
| 2013/0043468 A1* | 2/2013 | Adekore | H01L 29/267 |
| | | | 257/43 |
| 2013/0095606 A1* | 4/2013 | Bayraktaroglu | H01L 29/7869 |
| | | | 438/104 |
| 2015/0255575 A1* | 9/2015 | Wang | H01L 29/20 |
| | | | 257/288 |

OTHER PUBLICATIONS

K. Ip et al.; J. Vac. Sci. Tech. B; vol. 22(1); Jan./Feb. 2004.*
K. Ip et al.; J. Vac. Sci. Tech. B; vol. 22(1); Jan./Feb. 2004 (Year: 2004).*
W. H. Chang et al (High κ/InGaAs for Ultimate CMOS—Interfacial Passivation, Low Ohmic Contacts, and Device Performance; ECT Transactions; vol. 61; p. 112) (Year: 2014).*

\* cited by examiner

LOW RESISTANCE CONTACT INTERLAYER FOR SEMICONDUCTOR DEVICES

BACKGROUND

Technical Field

The present invention relates to semiconductor devices and processes, and more particularly to semiconductor devices that employ a metal interlayer to reduce contact resistance on InGaAs metal oxide semiconductor devices with II-VI source and drain regions.

Description of the Related Art

Field effect transistors (FETs) which employ III-V materials, such as GaAs, InP or InGaAs substrates, often include a doped source and drain region made of a similar material. In one common structure, III-V FETs include source/drain (S/D) regions formed from doped InGaAs (e.g., n+ InGaAs). n+ InGaAs is not ideal for S/D regions. In InGaAs nFETs, the n+ InGaAs S/D regions suffer from a low doping concentration (e.g., $1 \times 10^{19}$ cm$^{-3}$). In addition, there is relatively high junction leakage and high contact resistance in InGaAs S/D regions. Further, the formation process requires patterned implantation of n+ dopants, which adds time and expense to the process, and may result in junction damage.

These III-V FET structures often include metal contacts on the n+ InGaAs S/D regions. The metal contacts may include Ti, Pd, Au or Ni, and have a contact resistance (resistivity) that exceeds $5 \times 10^{-8}$ Ohm-cm$^2$. This significantly falls short of the desired goal contact resistance (resistivity) of less than about $5 \times 10^{-9}$ Ohm-cm$^2$.

SUMMARY

A semiconductor device includes a substrate and a p-doped layer including a doped III-V material on the substrate. An n-type material is formed on or in the p-doped layer. The n-type material includes an oxide of a II-VI material. An oxygen scavenging interlayer is formed on the n-type material. An aluminum contact is formed in direct contact with the oxygen scavenging interlayer to form an electronic device.

Another semiconductor device includes a substrate and a p-doped layer including a doped III-V material on the substrate. An n-type material is formed on or in the p-doped layer, and the n-type material includes ZnO. An oxygen scavenging interlayer is formed on the n-type material. The oxygen scavenging interlayer includes one of Ti and Er and has a thickness of about 10 nm or less. An aluminum contact is formed in direct contact with the oxygen scavenging interlayer to form an electronic device.

A method for forming a semiconductor device includes forming a p-doped layer including a doped III-V material on a substrate; forming an n-type material on or in the p-doped layer; the n-type material including ZnO; forming an oxygen scavenging interlayer on the n-type material; and forming a contact on the oxygen scavenging interlayer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
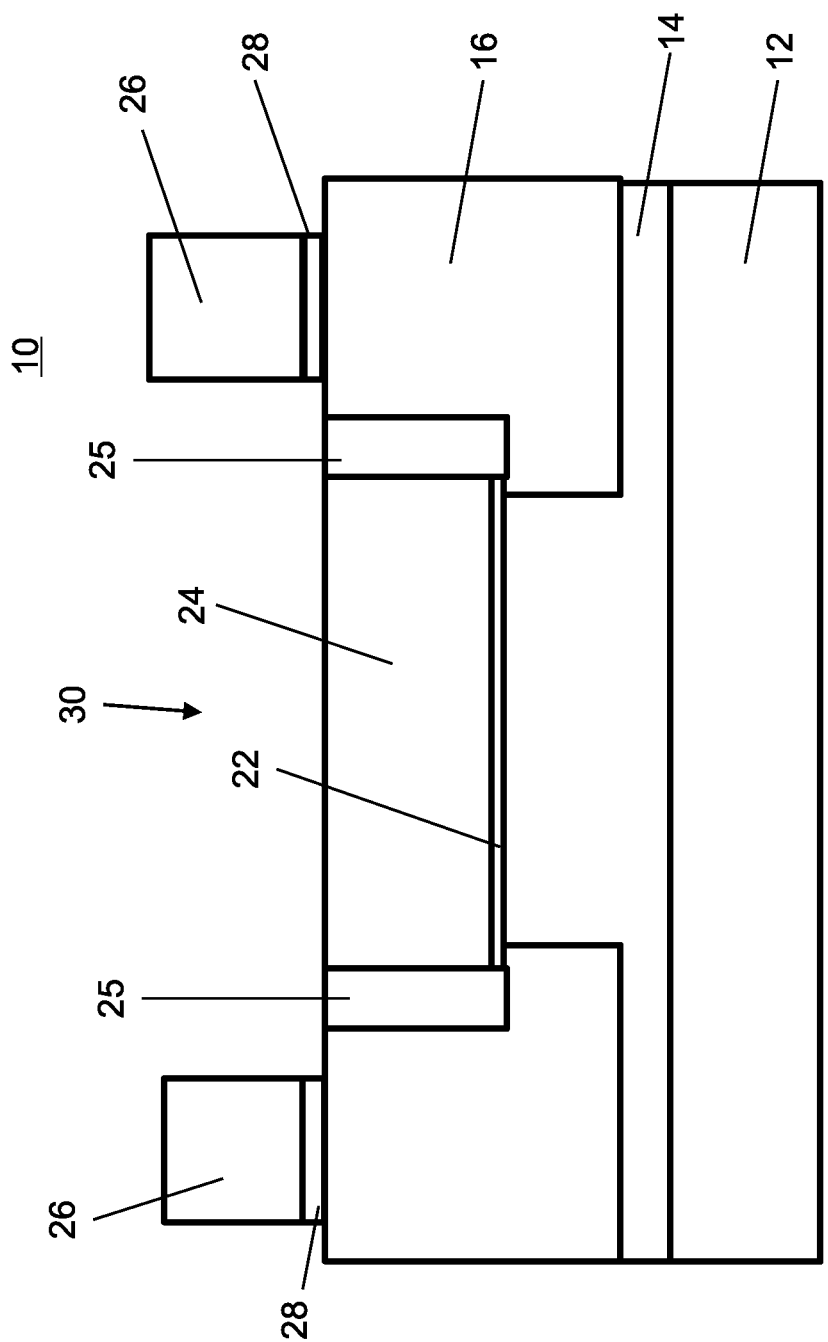
FIG. 1 is a cross-sectional view of a field effect transistor with a ZnO n-type layer forming source and drain regions with an oxygen scavenging interlayer to reduce contact resistance and an aluminum contact in accordance with the present principles.

In accordance with the present principles, electronic devices, structures and methods for formation are described for providing an interlayer contact layer that separates an n-doped semiconductor material (e.g., a doped ZnO) from a contact metal (e.g., Al) to reduce contact resistivity. Doped ZnO, and in particular, n$^+$ Al-doped ZnO (ZnO:Al or AZO) provides a replacement material for source and drain regions, active layers in diodes, etc. ZnO:Al has a similar electron affinity (~4.35-~4.4 eV) as n+ InGaAs, which is ~4.5 eV. ZnO:Al has a greater doping level that can be obtained, for example, up to about $5 \times 10^{21}$/cm$^3$. ZnO:Al processing is more compatible with metallization processing. For example, S/D regions may include metal layers formed thereon. ZnO:Al is more compatible with the metal material employed in forming these structures.

The formation of ZnO:Al also tends to be easier. For example, instead of epitaxial growth processes with patterned doping (e.g., for n+ InGaAs), ZnO:Al may be formed using atomic layer deposition (ALD), although other processes may be employed. This permits a doped layer with less surface damage. Materials like Al may be formed directly on the ZnO to form a contact with significantly reduced contact resistance. However, after AZO deposition, the surface of the AZO will be oxygen rich when exposed to the air. Oxygen-rich AZO on the surface increases resistance with Al contacts. Oxygen scavenging on the surface can reduce contact resistance. Therefore, a highly reactive metal can be employed for oxygen scavenging. Highly reactive metals may include, e.g., Ti, Er, Co, Cd, etc.

It is to be understood that the present invention will be described in terms of a given illustrative architecture; however, other architectures, structures, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip in accordance with the present principles that may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., InP, InGaAs or ZnO. These compounds may include different proportions of the elements within the compound, e.g., InGaAs includes $In_xGa_{1-x}As$, where x is less than or equal to 1, or ZnO includes $Zn_xO_{1-x}$ where x is less than or equal to 1, etc. In addition, other elements may be included in the compound, such as, e.g., ZnO:Al, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-section of a partially fabricated field effect transistor (FET) 10 is shown in accordance with one illustrative example. The FET 10 includes a substrate 12, a p-doped layer 14 and n-type source and drain regions 16. While the structures described and shown in accordance with the present principles are particularly useful for n-FETs, doping changes and materials may be adjusted to implement the present principles in p-FET devices as well. In one embodiment, the substrate 12 may include a III-V material (e.g., InP), silicon material or other suitable substrate or wafer material. Some embodiments implement a III-V material (e.g., for the p-doped layer 14 and/or the n-type material 16) grown on a Si substrate 12.

The p-doped layer 14 may include a p-doped InGaAs layer although other III-V materials may be employed. In conventional devices, the source/drain (S/D) regions would normally include regrown III-V materials formed using epitaxy with patterned doped regions by implantation processes.

In accordance with useful embodiments, a II-VI material may be employed for S/D regions 16. In particular, an n-type material, such as, ZnO or its alloys may be employed. ZnO can be applied to III-V materials with matching work functions. n-type material 16 may have a band gap of about 1 eV or less. While the ZnO can be employed to replace, InGaAs or other III-V materials, ZnO can be employed for semiconductor materials whose band gap is less than 1 eV, e.g., on Ge or similar materials.

A range of n-doping in ZnO is up to 2 atomic percent (e.g., $\sim 5 \times 10^{21}/cm^3$). ZnO dopants may include Al, B, Ga, In, etc, with Al:ZnO being preferred. ZnO may be deposited or grown by one or more of the following processes, epitaxy, sputtering, atomic layer deposition (ALD) and metal organic chemical vapor deposition (MOCVD). The ZnO preferably includes n+ ZnO:Al deposited by ALD. The ALD process forms the S/D regions 16 to provide less surface damage to underlying layers including layer 14. In addition, higher doping concentrations for the S/D regions 16 can be achieved with better stoichiometric control. In one example, the ALD process may include the use of a 13 cycle Zn deposition to 1 cycle Al deposition. The carrier concentration (electron density) of the S/D regions 16 may be between about $1 \times 10^{21}$ cm$^{-3}$ to about $5 \times 10^{21}$ cm$^{-3}$, and preferably about $3.0 \times 10^{21}$ cm$^{-3}$ for doped Aluminum Zinc Oxide (ZnO:Al) (AZO).

The n-type material 16 (e.g., ZnO:Al) is preferably crystalline in form. This includes a monocrystalline structure and may include a multi-crystal structure or other crystalline structure (micro, nano, etc.). However, the AZO material of layer 16 may also include amorphous phases. In one embodiment, the ZnO of layer 16 is amorphous. The underlying layers, e.g., p-doped layer 14 and substrate 12 are also preferably crystalline, but may include other phases.

The FET 10 is further processed by forming a gate dielectric 22, e.g., $HfO_2$, $Al_2O_3$, or other high dielectric constant material and/or insulating layers. A gate electrode 24 is then formed. The gate electrode 24 may include any suitable highly conductive material, e.g., Cu, Cr, Au, Ag, etc. The gate dielectric 22 and the gate conductor 24 may be formed prior to the formation of the S/D regions 16. In one embodiment, a gate structure 30 (e.g., gate dielectric 22, the gate conductor 24, spacers 25, etc.) may be employed to locate the S/D regions 16 (e.g., act as an etch mask for removing portions of layer 14 and/or act as a deposition mask for the II-VI material for the S/D regions 16).

An oxygen scavenging interlayer 28 is formed on the S/D regions 16. Contacts 26 are formed on the oxygen scavenging interlayer 28. The contacts 26 may include aluminum or other metals. Metals are more compatible with materials for S/D regions 16 than the III-V materials employed in conventional devices. The FET 10 may include metal contacts in a bi-layer arrangement, e.g., oxygen scavenging interlayer 28 and Al. Additional contact layers may also be employed. For example, a highly conductive material such as Au or Pt may be formed on the Al contact 26. Other metals or combinations of metals are also contemplated. The Al (or other metal layer) may be etched/patterned together with the oxygen scavenging interlayer 28.

After deposition of the S/D region 16, a surface of the S/D regions 16 is oxygen rich when exposed to the air. Oxygen-rich AZO on the surface increases resistance with Al contacts 26. However, by providing the oxygen scavenging interlayer 28, oxygen scavenging on the surface reduces the contact resistance. The oxygen scavenging interlayer 28 may include a highly reactive metal, such as, e.g., Ti, Er, Co, Cd, etc. The oxygen scavenging interlayer 28 may be deposited by ALD, chemical vapor deposition, evaporation, sputtering or any other suitable process. The oxygen scavenging interlayer 28 may include a thickness of between about 2 nm to about 20 nm with 2 nm to about 8 nm between preferred. A thinner oxygen scavenging interlayer 28 is better for less contact resistivity because a thicker oxygen scavenging interlayer 28 prevents Al dopant diffusion from contacts 26 to the AZO of the S/D regions 16.

It should be understood that in one particularly useful embodiment, the interlayer 28, preferably directly connects to Al metal to form a contact or a portion of a contact. The ZnO:Al to oxygen scavenging interlayer 28 would be expected to increase contact resistance; however, as data provided below shows, a thin oxygen scavenging interlayer 28 provides a low contact resistance connection.

In one embodiment, instead of a gate structure, the p-doped layer 14 and the n-type layer 16 may form a diode junction having a contact assembly (interlayer 28 and contact 26 as a top contact. The diode junction would be formed between layers 14 and 16. Other structures may also be employed.

Figure 2:
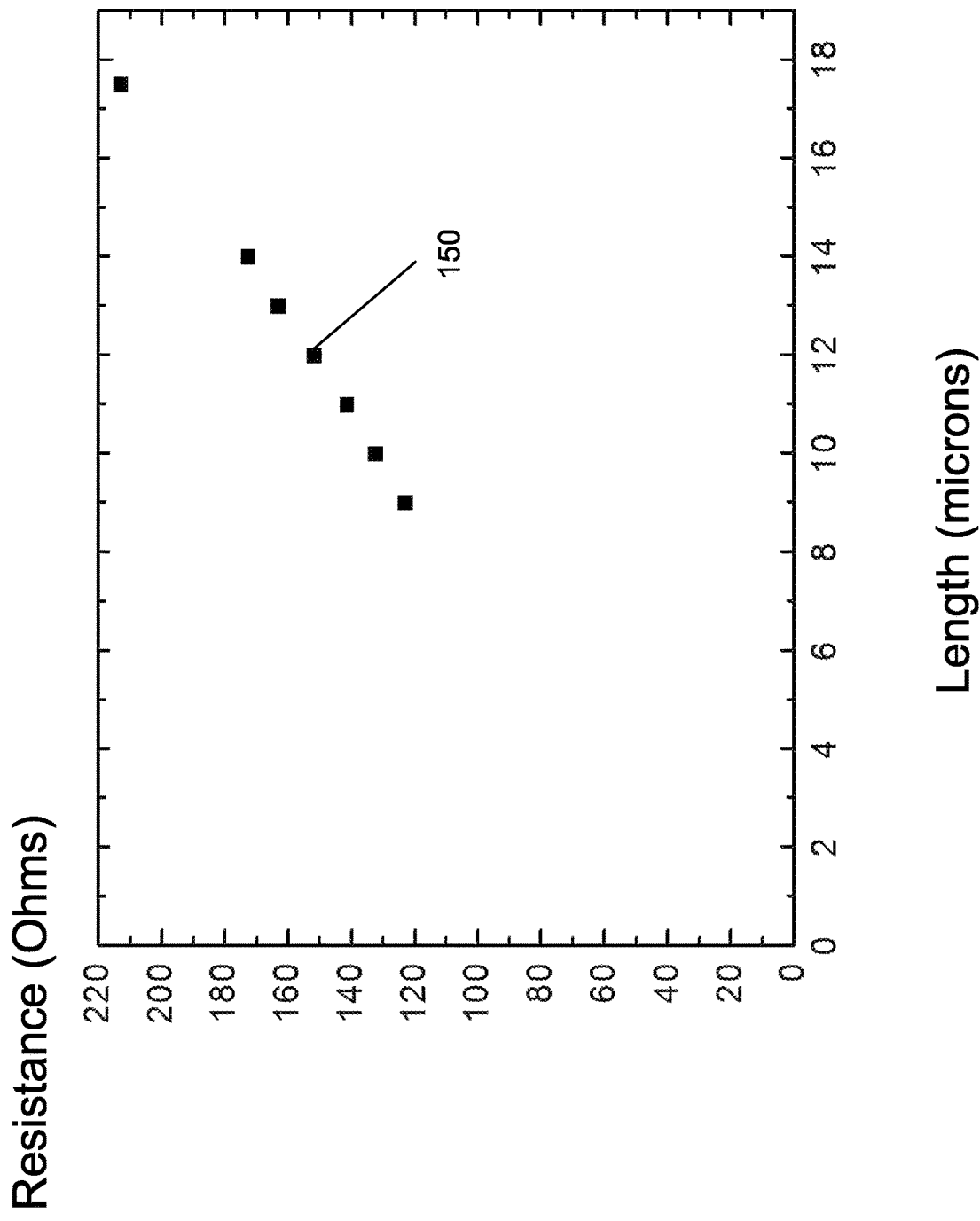
FIG. 2 is a plot of resistivity (Ohm-cm$^2$) versus length (microns) showing a relationship between resistivity and length for an AZO source/drain (S/D) region with an Al contact formed directly thereon.

Referring to FIG. 2, a plot 150 of resistivity (Ohm-$cm^2$) versus length (microns) for a contact is graphed. The graph shows a linear relationship between resistivity and length for an AZO S/D region with an Al contact formed directly thereon (in contact with the AZO) for a contact thickness of 18 microns.

Conventional III-V FET structures with metal contacts (e.g., Ti, Pd, Au or Ni) on the n+ InGaAs S/D regions have a contact resistance (resistivity) that exceeds $5\times10^{-8}$ Ohm-$cm^2$. The Al—ZnO:Al interface provides a contact resistance of about $2.8\times10^{-6}$ Ohm-$cm^2$ after oxidation has occurred. This does not fall within the desired contact resistance (resistivity) of less than $5\times10^{-9}$ Ohm-$cm^2$.

Figure 3:
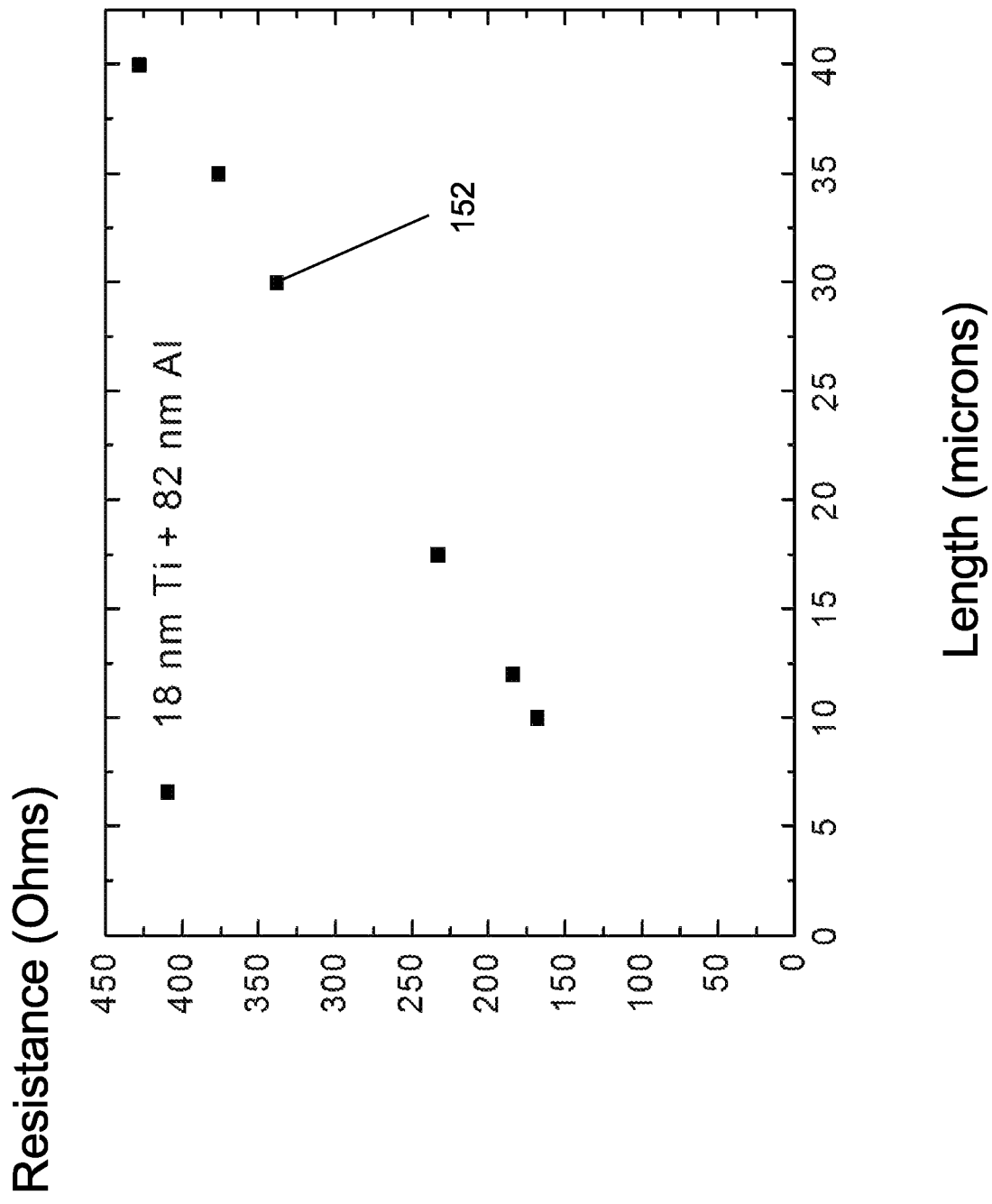
FIG. 3 is a plot of resistivity (Ohm-cm$^2$) versus length (microns) showing a relationship between resistivity and length for an AZO S/D region with a Ti interlayer (18 nm in thickness) and an Al contact in accordance with the present principles.

Referring to FIG. 3, a plot 152 of resistivity (Ohm-$cm^2$) versus length (microns) for a contact is graphed. The graph shows a relationship between resistivity and length for an AZO S/D region with a Ti interlayer (18 nm in thickness) formed thereon. An Al contact (82 nm in thickness) is formed directly on the Ti (See, e.g., FIG. 1).

Conventional III-V FET structures with metal contacts (e.g., Ti, Pd, Au or Ni) on the n+ InGaAs S/D regions have a contact resistance (resistivity) that exceeds $5\times10^{-8}$ Ohm-$cm^2$. The Al—ZnO:Al interface provides a contact resistance of about $2.8\times10^{-6}$ Ohm-$cm^2$ at a length of 18 microns (after some oxidation has occurred). This does not fall within the desired contact resistance (resistivity) of less than $5\times10^{-9}$ Ohm-$cm^2$, and represents the normal expected increase in resistivity with the use of a Ti contact material.

Figure 4:
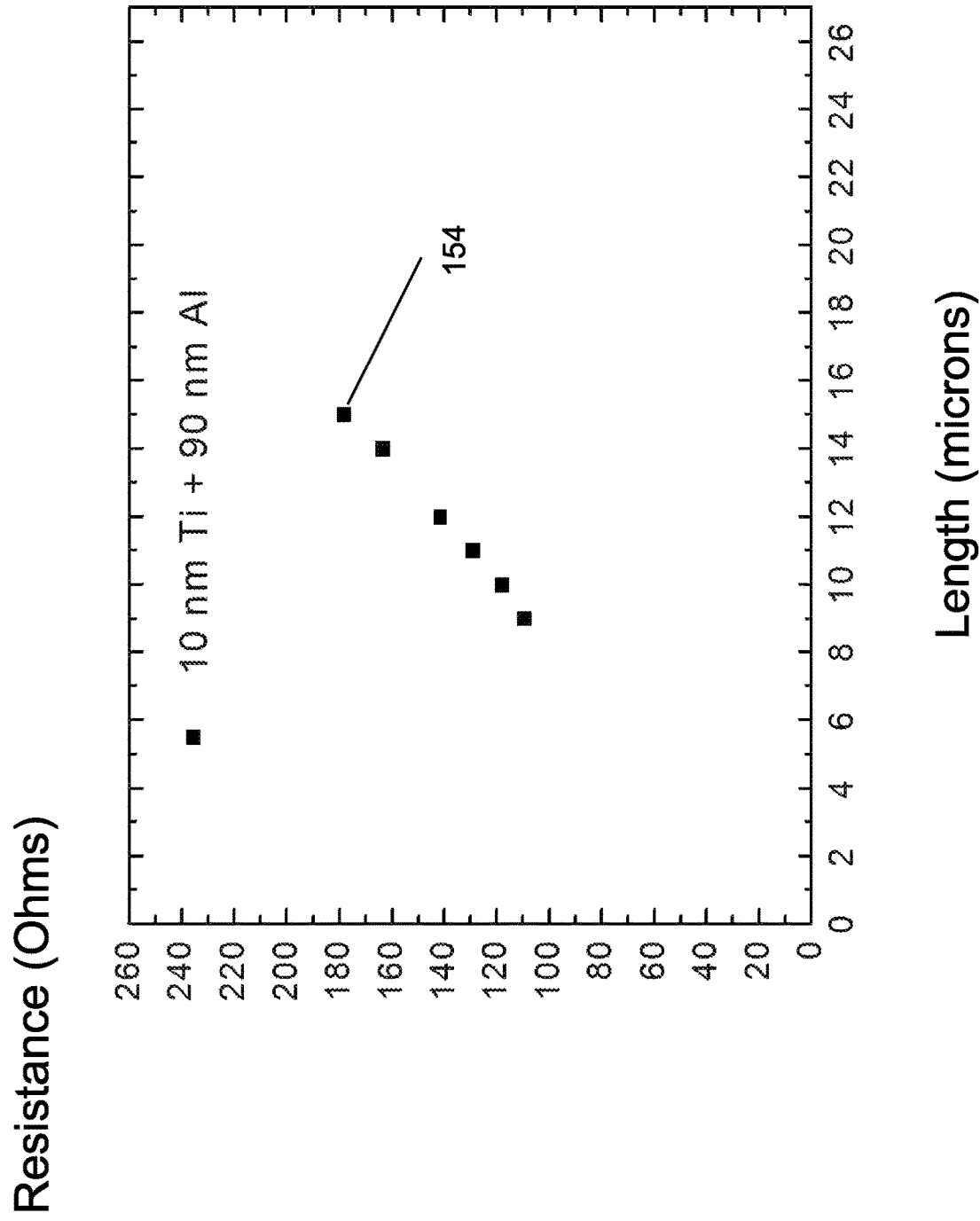
FIG. 4 is a plot of resistivity (Ohm-cm$^2$) versus length (microns) showing a relationship between resistivity and length for an AZO S/D region with a Ti interlayer (10 nm in thickness) and an Al contact in accordance with the present principles.

Referring to FIG. 4, a plot 154 of resistivity (Ohm-$cm^2$) versus length (microns) for a contact is graphed. The graph shows a relationship between resistivity and length for an AZO S/D region with a Ti interlayer (10 nm in thickness) formed thereon. An Al contact (90 nm in thickness) is formed directly on the Ti (See, e.g., FIG. 1).

The Al—Ti—ZnO:Al interface provides a contact resistivity of about $5.07\times10^{-8}$ Ohm-$cm^2$ at a length of 18 microns. While this is greater than the goal of $5\times10^{-9}$ Ohm-$cm^2$, it is comparable or surpasses the conventional resistivity of III-V FET structures with metal contacts (e.g., Ti, Pd, Au or Ni) on the n+ InGaAs S/D regions which have a contact resistivity that exceeds $5\times10^{-8}$ Ohm-$cm^2$.

Figure 5:
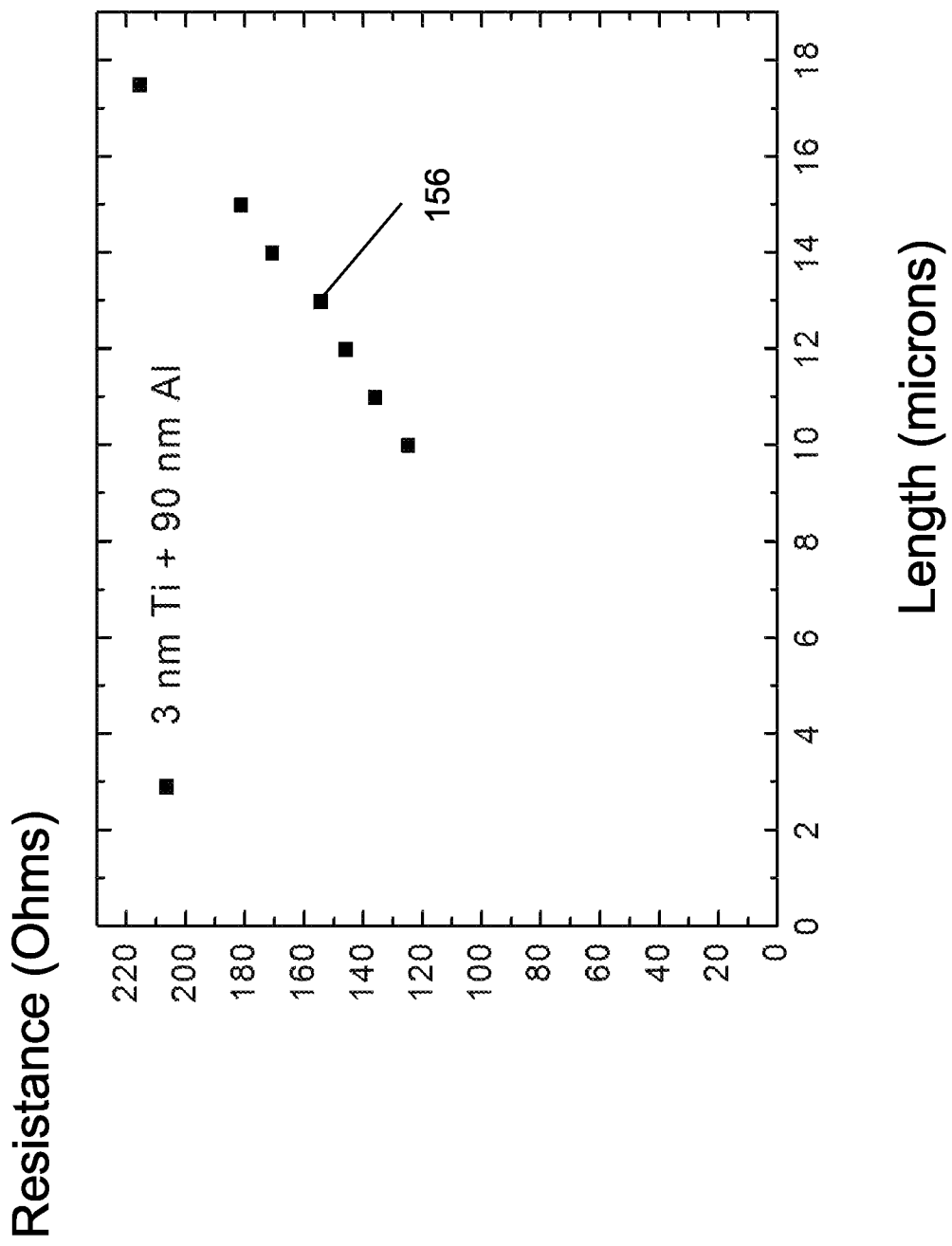
FIG. 5 is a plot of resistivity (Ohm-cm$^2$) versus length (microns) showing a relationship between resistivity and length for an AZO S/D region with a Ti interlayer (3 nm in thickness) and an Al contact in accordance with the present principles.

Referring to FIG. 5, a plot 156 of resistivity (Ohm-$cm^2$) versus length (microns) for a contact is graphed. The graph shows a relationship between resistivity and length for an AZO S/D region with a Ti interlayer (3 nm in thickness) formed thereon. An Al contact (90 nm in thickness) is formed directly on the Ti (See, e.g., FIG. 1).

The Al—Ti—ZnO:Al interface provides a contact resistivity of about $1.16\times10^{-8}$ Ohm-$cm^2$ at a length of 18 microns. This provides significant improvement over the Al alone and the conventional III-V FET structures. The thin layer of Ti provides oxygen scavenging and still permits a reasonable amount of Al diffusion through it to provide a good value for contact resistivity.

It should be understood that the present principles have been illustratively demonstrated using a transistor structure; however, the contact structure may be employed with any electronic device, including diodes, lasers, passive elements (e.g., inductor, capacitors, resistors), junctions, solar cells, etc. The present principles may be employed with any devices or components that may have an Al-oxygen scavenging metal-ZnO contact structure. While Al and AZO are preferred materials, other II-VI materials and metal contacts may be employed.

Figure 6:
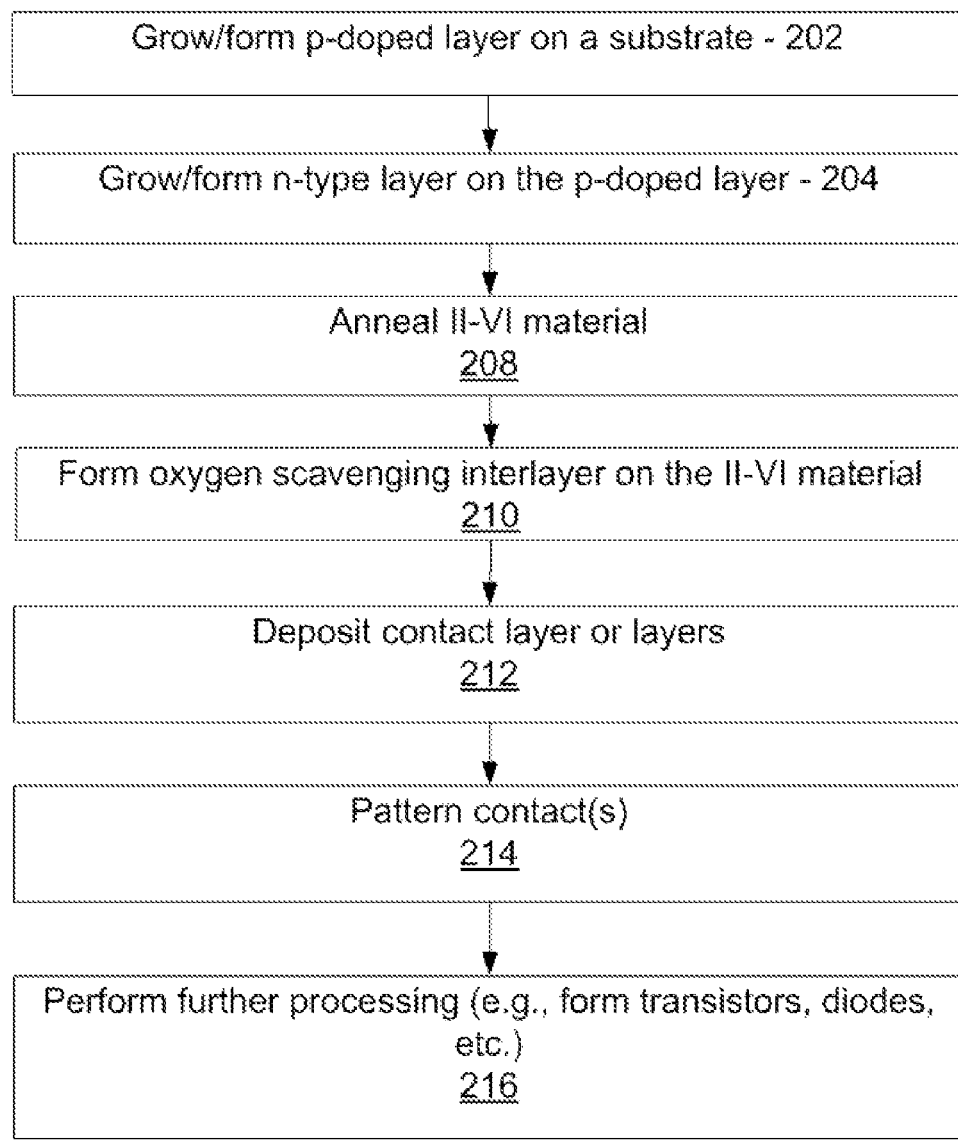
FIG. 6 is a block/flow diagram showing methods for forming a semiconductor device in accordance with illustrative embodiments.

Referring to FIG. 6, a method for forming a semiconductor device is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a p-doped layer is grown or formed on (or in) a substrate, e.g., III-V substrate (e.g., InP, GaAs, InGaAs), Si substrate, Ge substrate, etc. The p-doped layer preferably includes a III-V material. III-V materials may include, e.g., InP, InAs, AlAs, AN, GaN, InN, AlP, GaP, InP, AlAs, GaAs, InAs, etc. or tertiary compounds, e.g., InGaAs, AlGaAs, etc.

In block 204, an n-type layer/material is grown or formed. The n-type layer includes a doped II-VI material, such as ZnO, indium zinc oxide, or indium tin oxide (ITO) (or other II-VI material including oxygen) formed on the p-doped layer. This formation may include employing an ALD process, MOCVD, sputtering, epitaxial growth, etc. The n-type layer is formed with (or will be processed to have) a carrier concentration of between about $1 \times 10^{21}$ cm$^{-3}$ to about $5 \times 10^{21}$ cm$^{-3}$, preferably about $3 \times 10^{21}$ cm$^{-3}$. This is due to the material and its formation processing. Formation of ZnO by ALD is preferable and results in minimal surface damage to the underlying layers. The ZnO material may be crystalline or amorphous.

In block 208, the II-VI n-type layer may be annealed. This layer preferably includes aluminum-doped ZnO. The doping may need to be activated to improve device characteristics. For example, the anneal process may include a rapid thermal anneal (RTA) at between about 200 degrees C. to about 600 degrees C. for less than one minute. In one embodiment, the RTA includes a 300 degree C. anneal for about 30 seconds.

In block 210, an oxygen scavenging interlayer is formed on the n-type layer and includes a highly reactive metal, e.g., Ti, Er, etc. The formation of the interlayer may include employing an ALD process, CVD, sputtering, etc. The interlayer preferably includes a thickness of 10 nm or less, although thinner or thicker dimensions are also contemplated depending on materials.

In block 212, a contact layer or contact layers are formed directly on oxygen scavenging interlayer. The contact layer may include an aluminum contact layer, which may be part of a bi-layer structure with another metal or metals deposited thereon. The contact layer may be employed as a dopant source to the n-type layer or the II-VI n-layer through the interlayer. The contact layer may be formed by any suitable deposition process, e.g., ALD, sputtering, chemical vapor deposition, etc.

In block 214, the contact layer (or layers) and the oxygen scavenging interlayer are patterned to form the contact. The contact layers (and the interlayer) may be concurrently patterned using a mask and an etching process. Alternately, the contact may be formed using a damascene process or other process.

The contacts formed in accordance with the present principles (with or without the interlayer) provide a low resistivity, preferably less than about $5 \times 10^{-8}$ Ohm-cm$^2$, and more preferably less than about $2 \times 10^{-8}$ Ohm-cm$^2$.

In block 216, further processing may be performed to complete the device. The device may include a transistor, diode, inductor, resistor, capacitor, solar cell, etc. Further processing may include forming a gate structure, metallizations, etc.

Having described preferred embodiments for a low resistance contact interlayer for semiconductor devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
   a substrate;
   a p-doped channel layer including a doped III-V material on the substrate;
   a gate structure on the p-doped channel layer including a gate conductor and sidewall spacers;
   an n-type doped II-VI material formed directly on or in the p-doped channel layer adjacent to, and extending below, the gate structure, with a top surface of the n-type doped II-VI material and a top surface of the gate structure forming a co-planar surface, wherein the n-type doped II-VI material forms a source/drain region of the semiconductor device;
   an oxygen scavenging interlayer formed directly on the top surface of the n-type doped-II-VI material to absorb oxygen from the n-type doped-II-VI material; and
   an aluminum contact formed in direct contact with the oxygen scavenging interlayer to form an electronic device, the oxygen scavenging interlayer having a thickness providing a contact resistivity of less than about $2.0 \times 10^{-8}$ Ohm-cm$^2$.

2. The semiconductor device as recited in claim 1, wherein the n-type doped II-VI material includes Al doped ZnO.

3. The semiconductor device as recited in claim 1, wherein the thickness of the oxygen scavenging layer is about 3 nm.

4. The semiconductor device as recited in claim 1, wherein the oxygen scavenging interlayer includes Ti.

5. The semiconductor device as recited in claim 1, wherein the oxygen scavenging interlayer includes Er.

6. The semiconductor device as recited in claim 1, wherein the thickness of the oxygen scavenging layer is about 10 nm or less.

7. A semiconductor device, comprising:
   a substrate;
   a p-doped channel layer including a doped III-V material on the substrate;
   a gate structure on the p-doped channel layer including a gate conductor and sidewall spacers;
   an n-type ZnO material formed directly on or in the p-doped channel layer adjacent to, and extending below, the gate structure, with a top surface of the n-type ZnO material and a top surface of the gate structure forming a co-planar surface, wherein the n-type ZnO material forms a source/drain region of the semiconductor device;
   an oxygen scavenging interlayer formed directly on the top surface of the n-type ZnO material to absorb oxygen from the n-type ZnO material, the oxygen scavenging interlayer including one of Ti and Er and having a thickness of about 10 nm or less; and
   an aluminum contact formed in direct contact with the oxygen scavenging interlayer to form an electronic device, the thickness of the oxygen scavenging layer providing a contact resistivity of less than about $2.0 \times 10^{-8}$ Ohm-cm$^2$.

8. The semiconductor device as recited in claim 7, wherein the n-type ZnO material includes Al doped ZnO.

9. The semiconductor device as recited in claim 7, wherein the n-type ZnO material forms a junction with the p-doped layer.

10. The device as recited in claim 7, wherein the thickness of the oxygen scavenging layer is about 3 nm.

11. A method for forming a semiconductor device, comprising:
   forming a p-doped channel layer including a doped III-V material on a substrate;
   forming a gate structure on the p-doped channel layer including a gate conductor and sidewall spacers;
   forming a source/drain region of the semiconductor device with an n-type doped II-VI material directly on or in the p-doped channel layer adjacent to, and extending below, the gate structure, with a top surface of the n-type doped II-VI material and a top surface of the gate structure forming a co-planar surface;
   forming an oxygen scavenging interlayer directly on the top surface of the n-type doped II-VI material to absorb oxygen from the n-type doped II-VI material; and
   forming a contact on the oxygen scavenging interlayer, the oxygen scavenging layer having a thickness providing a contact resistivity of less than about $2.0 \times 10^{-8}$ Ohm-cm$^2$.

12. The method as recited in claim 11, wherein the n-type doped II-VI material forms one of source and drain regions for a field effect transistor or a junction with the p-doped layer.

13. The method as recited in claim 11, wherein the oxygen scavenging interlayer includes one of Ti and Er.

14. The method as recited in claim 11, wherein the thickness of the oxygen scavenging layer is about 10 nm or less.

15. The method as recited in claim 14, wherein the thickness of the oxygen scavenging layer is about 3 nm.

16. The method as recited in claim 11, wherein the n-type doped II-VI material includes Al doped ZnO.

* * * * *